United States Patent
Linn et al.

[11] Patent Number: 5,837,603
[45] Date of Patent: Nov. 17, 1998

[54] PLANARIZATION METHOD BY USE OF PARTICLE DISPERSION AND SUBSEQUENT THERMAL FLOW

[75] Inventors: Jack H. Linn, Melbourne; John J. Hackenberg, Palm Bay; David A. DeCrosta, Melbourne, all of Fla.

[73] Assignee: HArris Corporation, Melbourne, Fla.

[21] Appl. No.: 643,295

[22] Filed: May 8, 1996

[51] Int. Cl.⁶ .......................... H01L 21/28; H01L 21/304
[52] U.S. Cl. .................... 438/632; 438/646; 438/760; 438/782; 438/783
[58] Field of Search .................. 438/632, 646, 438/760, 782, 783

[56] References Cited

U.S. PATENT DOCUMENTS

| | | | |
|---|---|---|---|
| 3,212,921 | 10/1965 | Pliskin et al. | 117/101 |
| 3,212,929 | 10/1965 | Pliskin et al. | 117/201 |
| 4,420,503 | 12/1983 | Leung et al. | 427/85 |
| 4,492,717 | 1/1985 | Pliskin et al. | 438/632 |
| 4,539,744 | 9/1985 | Burton | 29/580 |
| 4,885,262 | 12/1989 | Ting et al. | 437/189 |
| 5,037,777 | 8/1991 | Mele et al. | 437/195 |
| 5,104,482 | 4/1992 | Monkowski et al. | 156/643 |
| 5,145,723 | 9/1992 | Ballance et al. | 427/397.7 |
| 5,258,334 | 11/1993 | Lantz, II | 438/760 |
| 5,284,804 | 2/1994 | Moslehi | 437/228 |
| 5,312,512 | 5/1994 | Allman et al. | 156/636 |
| 5,331,117 | 7/1994 | Bryant et al. | 174/250 |
| 5,422,308 | 6/1995 | Nicholls et al. | 437/192 |
| 5,424,570 | 6/1995 | Sardella et al. | 257/333 |
| 5,458,912 | 10/1995 | Camiletti et al. | 427/126.4 |

OTHER PUBLICATIONS

Okuhura et al, "A Novel Global Planarization Process Using Gap Filling with Self–Aligned Silica Spacer", 1995 VMIC Conference, pp. 233–239, Jun. 1995.

*Primary Examiner*—John Niebling
*Assistant Examiner*—Thomas G. Bilodeau
*Attorney, Agent, or Firm*—Rogers & Killeen

[57] ABSTRACT

A method of smoothing irregularities in a surface of a semiconductor device using flowable particles which are dispersed onto the surface of the semiconductor device. The irregularities in the surface of the semiconductor device are filled with flowable particles smaller in size than the irregularities which are to be smoothed, and the particles are thereafter heated so that they flow and fill the irregularities, forming a smooth layer of flowable particle material which does not require polishing. The flowable particles may be mixed with non-flowable particles which are encapsulated in the layer of flowable particle material to form a homogeneous layer. The non-flowable particles may be augmentors which modify the properties of the layer. The particles may be dispersed with a spin-on process.

23 Claims, 3 Drawing Sheets

PLANARIZATION METHOD BY USE OF PARTICLE DISPERSION AND SUBSEQUENT THERMAL FLOW

BACKGROUND OF THE INVENTION

The present invention is directed to semiconductor device planarization methods and more particularly to a method of smoothing irregularities in a surface of a semiconductor device using flowable particles which are dispersed onto the surface of the semiconductor device with a spin-on process.

Semiconductor devices have some surfaces which are desirably smooth, but which include irregularities caused by the presence of surface features (e.g., polysilicon structures, metal gates, wire runners, etc.) and by nonuniformities in the manufacturing process. The irregularities may be of various sizes and shapes and may be intended (such as the polysilicon structures) or unintended (resulting from the manufacturing process).

The need to smooth the surface is found in some semiconductor devices which include tiers of components and/or structures that are placed atop one another. Each tier should have a flat foundation so that its components are horizontally aligned to assure proper operation. To this end, the top of each tier is desirably smooth to provide a flat foundation for the succeeding tier (a "planarization" process). Smooth surfaces may also be provided in semiconductor devices for various other purposes such as post polysilicon oxide application, tungsten post technology, passivation opaqueness, scratch protection and the like which are known and need not be detailed for an understanding of the present invention. Note that reference herein to a surface of a semiconductor device includes both a substrate surface and a surface of any tier which may be layered on top of a substrate.

Known planarization processes use a variety of techniques to smooth a semiconductor device surface, all of which generally involve the addition of a further layer on top of the surface to be smoothed. However, the sizes of the irregularities on the surface and the materials involved present several vexing problems. For example, some of the materials used to form the additional layer do not adhere well to the surface of the semiconductor device, some of the techniques leave unfilled gaps (e.g., when the irregularities are too small or oddly shaped) which can affect device operation, the layer may not be continuous as may be needed when the layer is to form a dielectric between two device tiers, and the top of the added layer may require a further polishing step to achieve the desired smoothness.

One technique uses spin-on-glass (SOG) and a thermal treatment to form an SiO-like film to fill the irregularities and chemical mechanical polishing (CMP) to smooth the filled surface. One of the advantages of the present invention is that the CMP step is not required as this step is expensive, time consuming and involves hazardous materials and is desirably avoided. A further advantage of the present invention is that a chemical reaction to form $SiO_2$ from the organosilicate precursor is not required. See, for example, U.S. Pat. No. 5,312,512 to Allman, et al.

Another SOG technique employs spherical silica spacers to fill the irregularities which are then overlain with SOG. The silica spacers are all the same size as the depth of the uniformly deep irregularities and are coated with an adhesive. This technique is not effective for smoothing irregularities of various depths on a single surface (such as unintended irregularities caused by the manufacturing process), and includes the additional step of coating the spacers with an adhesive. See, for example, "A Novel Global Planarization Process Using Gap Filling With Self-Aligned Silica Spacer," Ohkura, et al. VMIC Conference, June, 1995.

A related problem with the formation of layers on surfaces of semiconductor devices is that a homogeneous layer with augmentor particles dispersed throughout are difficult, if not impossible, to produce. Augmentor particles can change the properties of the layer (dielectric strength, opaqueness, etc.) and may be provided in various densities in the layer to selectively change a characteristic. An added advantage of the present invention is that it can be used to easily make such an augmented layer with selectable properties.

Accordingly, it is an object of the present invention to provide a novel method of smoothing irregularities in a surface of a semiconductor device which obviates the problems of the prior art.

It is another object of the present invention to provide a novel method of smoothing irregularities in a surface of a semiconductor device in which flowable particles fill the irregularities and in which the particles are flowed to smooth the surface of the semiconductor device.

It is yet another object of the present invention to provide a novel method of smoothing irregularities in a surface of a semiconductor device in which flowable particles are dispersed on the surface with a spin-on process to fill the irregularities in the surface.

It is still another object of the present invention to provide a novel method of smoothing irregularities in a surface of a semiconductor device in which a mixture of flowable particles and non-flowable particles are dispersed onto the surface and heated so that the non-flowable particles are encapsulated in the flowable particle material.

It is a further object of the present invention to provide a novel method of smoothing irregularities in a surface of a semiconductor device in which flowable particles having diameters of from 0.01 $\mu$m to 2.0 $\mu$m which are less than the minimum size of the irregularities which are to be smoothed are dispersed onto the surface of the semiconductor device with a spin-on process so as to fill the irregularities in the surface of the semiconductor device with the particles, and the particles are thereafter heated to a temperature from 400° to 900° C. so that they flow and fill the irregularities.

It is yet a further object of the present invention to provide a novel method of forming an augmented, homogeneous layer on a surface of a semiconductor device, and a device having such a layer.

It is still a further object of the present invention to provide a novel method of selectively changing a property of an augmented, homogeneous layer on a surface of a semiconductor device.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1A:
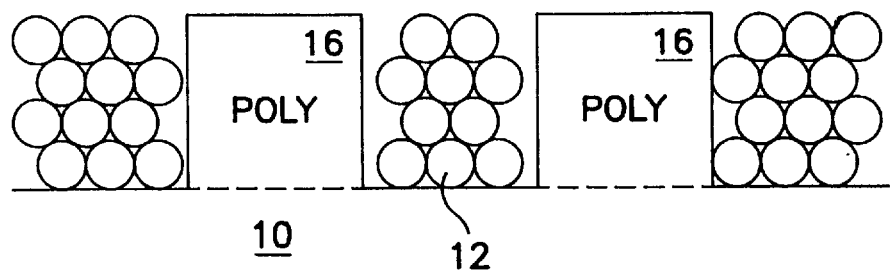
FIGS. 1A–C are vertical cross sections of semiconductor devices having their irregularities filled with flowable particles of various sizes and to various heights.
Figure 1B:
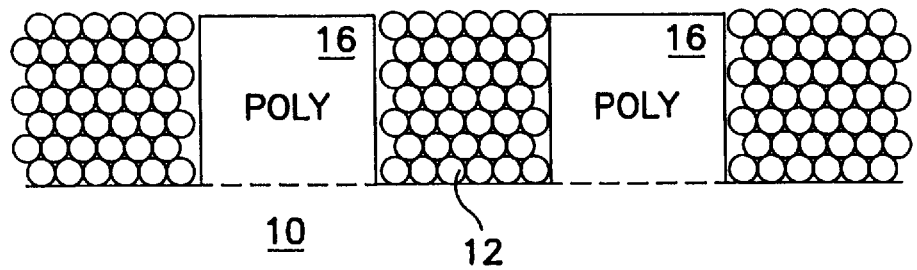
Figure 1C:
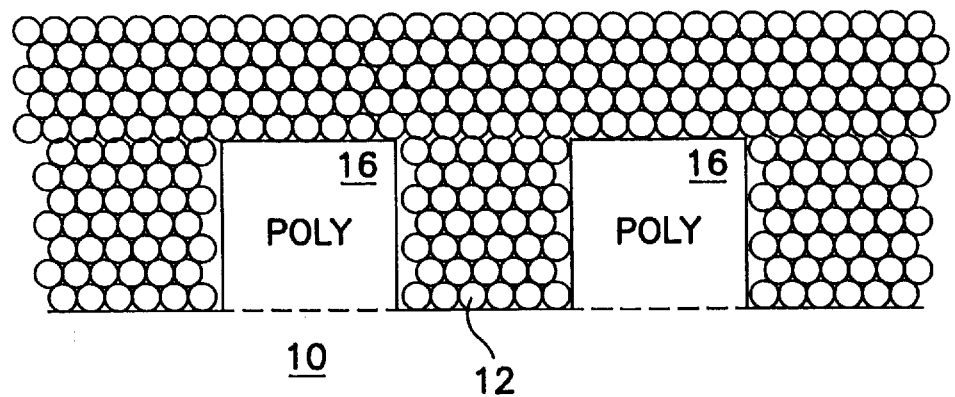
Figure 2A:
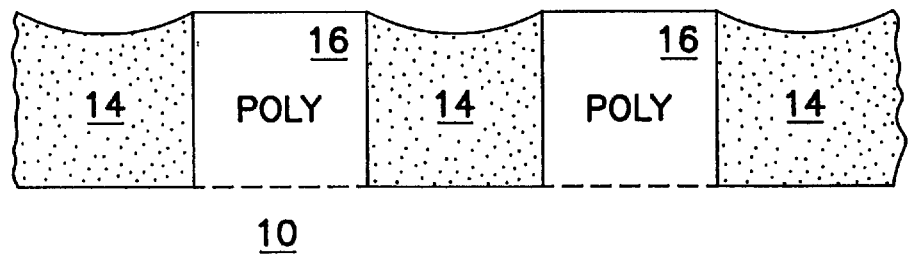
FIGS. 2A–B are vertical cross sections of FIGS. 1B–C in which the flowable particles have been heated so as to flow and fill the irregularities.
Figure 2B:
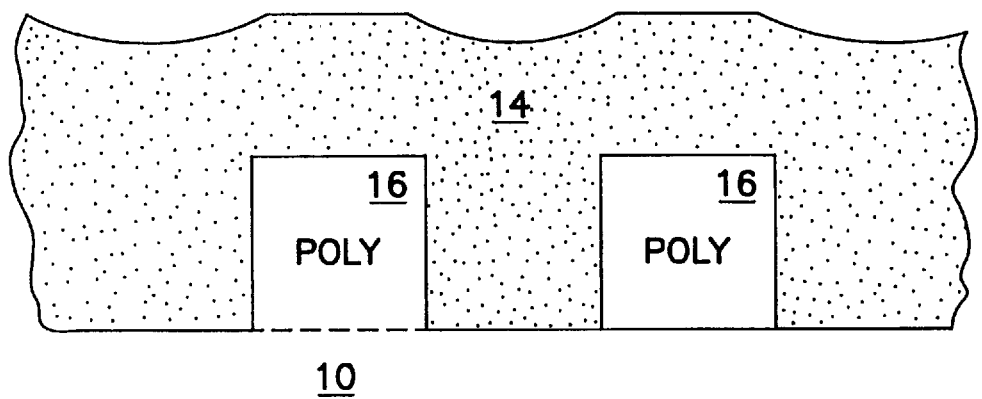

With reference now to FIGS. 1A–C and 2A–B, an embodiment of the method of the present invention smooths irregularities in a surface of a semiconductor device 10 using flowable particles 12 which may be dispersed onto the surface of the semiconductor device. The irregularities in the surface of the semiconductor device may be filled with flowable particles 12 smaller in size than the irregularities which are to be smoothed, and the particles may thereafter be heated so that they flow and fill the irregularities, forming a generally homogeneous layer 14 of flowable particle material (homogeneous meaning having common properties throughout). Layer 14 may have gaps, such as in FIG. 2A, or may be continuous, such as in FIG. 2B, depending on the nature of the surface to be smoothed.

Flowable particles 12 may be solid particles formed of any flowable material suitable for the smoothing layer on the semiconductor device, such as phospho-silicate glass (PSG), boron doped PSG (BPSG), boron-silicate glass (BSG), arsenic doped $SiO_2$, fluorine doped $SiO_2$, perhydrosilazane and the like. Flowable particles change state from a solid state to a flowable one when heated to a known or determinable temperature for a known or determinable period of time. Desirably the heating does not affect the semiconductor device, and to this end the particles may be heated to about 400° to 900° C., with about 800° C. being preferred for irregularities formed by polysilicon structures. When so heated, particles 14 flow and fill the irregularities between the polysilicon structures such as illustrated in FIGS. 1–2 without leaving gaps.

The particles are desirably smaller than the smallest irregularity that is to be smoothed, and to this end may have a size smaller than the smallest irregularity height and/or width of significant size. (Not all irregularities are large enough to warrant filling and such minor irregularities are not considered herein.) For example, and with further reference to FIGS. 1A–B, for polysilicon structures 16 (or tungsten posts which have a similar cross section) the particle size may be about 5 to 20% of the height of the structures. In one embodiment the particles are spherical with diameters of about 0.01 μm to 2.0 μm, with 0.1 μm being preferred. The particles may be conventionally manufactured and/or may be provided from commercial sources. The flowable particle type may be chosen based on factors such as cost, availability, spinning interaction, cohesiveness, electrostatic charge, etc.

The particles may be dispersed onto the surface of the semiconductor device in a conventional spin-on process similar to that used for SOG. To facilitate the spin-on process, the particles may be mixed in a solvent which helps disperse the particles. The solvent may be water, iso-propyl alcohol (IPA), methyl-iso-butyl ketone (MIBK), phosphoric acid, boric acid and the like, and mixtures thereof. Ultrasonic and/or nebulation techniques may be used to enhance particle dispersion in the solvent. The spin-on process may be operated at about 10 to 500 RPM, with about 100 RPM being preferred.

The coverage provided by layer 14 depends on various factors which may be varied as needed depending on the aspect ratio of the irregularities, where the aspect ratio is the ratio of the irregularity width to irregularity height. For example, factors such as particle size, particle distribution, particle/solvent viscosity, solvent type, spin speed, and number of layers applied may be adapted as needed for various aspect ratios.

In an alternative embodiment of the method, particles 12 may be heated so that they partially flow to improve adhesion of the particles to each other. Partial flow may be achieved by heating particles 12 for a shorter period of time or to a lower temperature than used for complete flow. The result is that particles 12 adhere to each other but do not completely flow and thus do not form a solid layer 14 (i.e., some interparticle gaps may remain). This step may be an interim step used to hold the particles in place during processing before the final heating step.

Cooling of the heated device may be conventional. As will be appreciated, the cooled layer 14 will settle slightly from the level of the particles before heating due to filling of gaps between particles. To this end, the irregularities may be overfilled by a percentage determinable from the particle size and material.

Figure 3:
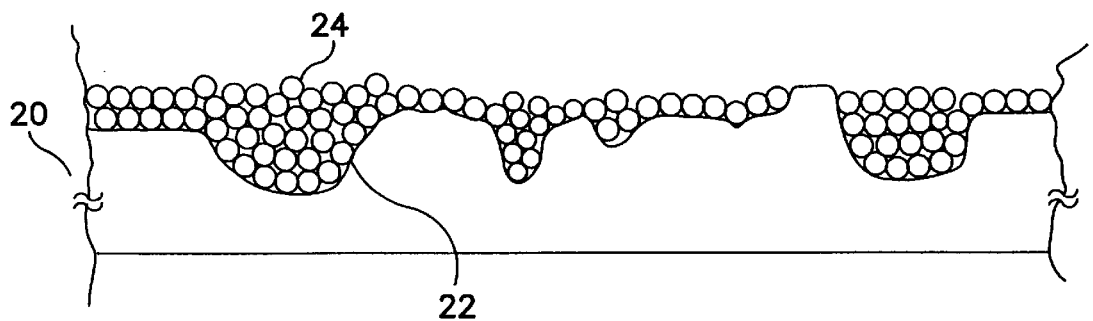
FIGS. 3 and 4 are vertical cross sections of a semiconductor device with irregularities filled with flowable particles, and the resulting layer after flow.
Figure 4:
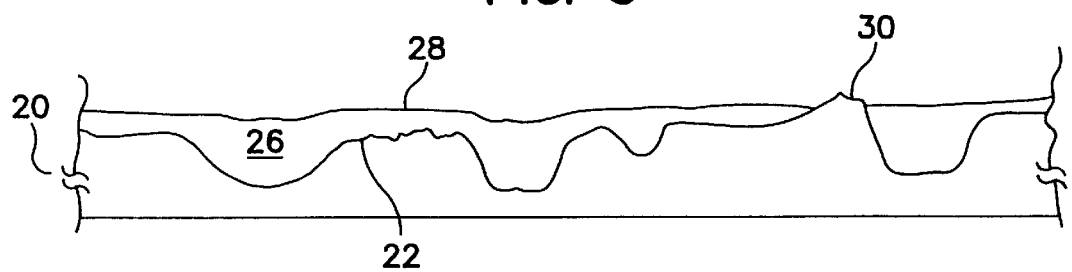

The method may be further understood with reference to FIGS. 3 and 4 which depict a vertical cross section of a semiconductor device 20 with an irregular surface 22 which may have been introduced to cover a trenched substrate (e.g., one with trench isolation) which is to be smoothed. Plural particles 24 may be dispersed onto surface 22 to fill its irregularities. After heating, particles 24 form a layer 26 (FIG. 4) which provides a substantially smooth top 28 to device 20. The smoothness of the top 28 may be determined by particle size and material and by the degree of flow. The thickness of layer 26 may vary as needed. While in most applications of the present invention layer 26 will cover the entirety of surface 22 (e.g., for electrical isolation), this is not required of the present invention as illustrated by projection 30.

Figure 5A:
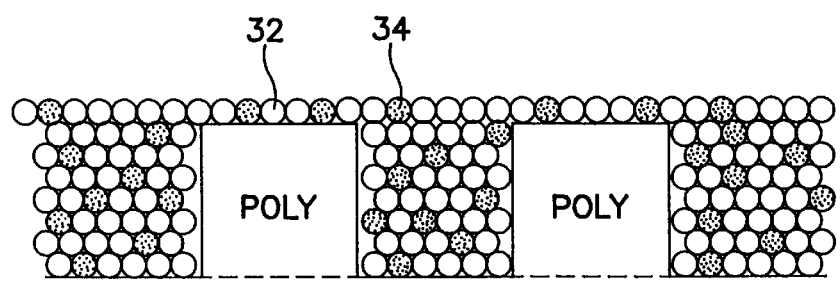
FIGS. 5A–B are vertical cross sections of a further semiconductor device having its irregularities filled with a mixture of flowable and non-flowable particles, and the resulting layer after flow.
Figure 5B:
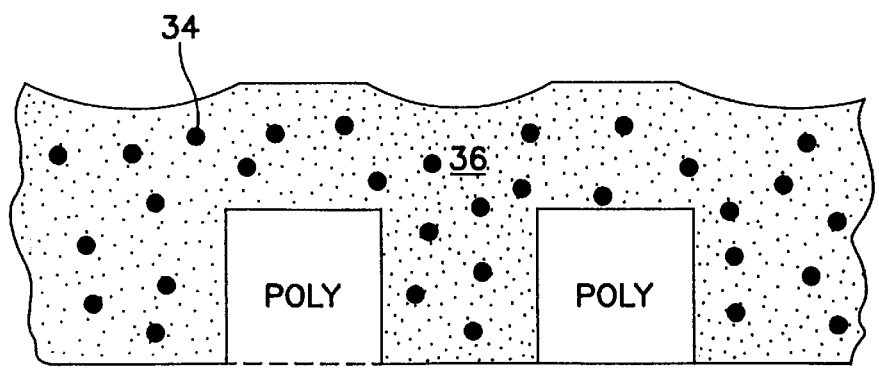

A further embodiment of the present invention provides the added advantage that the invention also may be used to make a homogeneous layer containing augmentors, regardless of whether the underlying surface is to be smoothed. With reference to FIGS. 5A–B, flowable particles 32 may be mixed (augmented) with non-flowable particles 34 which may affect the properties of the layer 36 of flowable particle material. Non-flowable particles 34 are those which do not change from a solid state when flowable particles 32 are heated to flow. For example, layer 36 may be augmented with non-flowable particles 34 which modify one or more properties of the layer, such as its dielectric constant, opaqueness, film charge, radiation resistance, scratch resistance, etc. Non-flowable particles 34 may be any suitable material such as silicon carbide, diamond, titanium dioxide, zinc oxide, aluminum oxide, aluminum nitride, boron nitride and the like and mixtures thereof which may be chosen based on the property to be affected and/or the type of flow particles used. The density of non-flowable particles 34 in layer 36 may be varied to selectively change the property affected by the particles. As will be appreciated by those of skill in the art, heretofore it has been difficult, if not impossible, to provide a homogeneous layer, such as layer 36 in FIG. 5B, which has specific augmentors mixed throughout.

In a further embodiment dopants may be used for enhancement. For example, a dopant such as boron, phosphorous, arsenic, antimony, fluorine, and the like may be implanted into the flowable particles, the layer of flow particle material or the non-flowable particles. The particles may be doped by absorption by using liquids such as $H_3PO_4$ and $H_3BO_3$.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A method of smoothing irregularities in a surface of a semiconductor device comprising the steps of:
   (a) augmenting flowable particles with non-flowable particles;
   (b) dispersing the particles onto a surface of the semiconductor device which is to be smoothed so that the particles fill the irregularities in the surface of the semiconductor device; and
   (c) altering the physical state of the particles so that they flow and thereby encapsulate the non-flowable particles and fill the irregularities so that the surface of the semiconductor device is substantially smoothed with a layer of flowed material from the flowable particles.

2. The method of claim 1 wherein the step of augmenting the flowable particles comprises the step of providing the non-flowable particles which comprise at least one of silicon carbide, diamond, titanium dioxide, zinc oxide, aluminum oxide, aluminum nitride and boron nitride.

3. The method of claim 1 wherein the step of altering comprises the step of heating the particles.

4. The method of claim 3 wherein the step of dispersing the particles comprises the step of spinning the particles onto the surface of the semiconductor device with a spin-on process.

5. The method of claim 4 wherein the step of dispersing the particles further comprises the step of mixing the particles in a solvent before they are dispersed in the spin-on process.

6. The method of claim 5 wherein the solvent is one of water, iso-propyl alcohol, methyl-iso-butyl Ketone, phosphoric acid, boric acid, and mixtures thereof.

7. The method of claim 5 wherein the step of dispersing the particles further comprises the step of applying an ultrasonic frequency to the mix of the particles and the solvent to facilitate dispersion of the particles in the solvent.

8. The method of claim 4 wherein the spin-on process is carried out at 10 to 500 RPM.

9. The method of claim 3 wherein the step of dispersing the particles comprises the step of providing the particles which have diameters of from 0.01 $\mu$m to 2.0 $\mu$m and which are smaller than the smallest irregularity to be filled.

10. The method of claim 3 wherein the step of heating comprises the step of heating the particles to a temperature from 400° to 900° C.

11. The method of claim 3 further comprising the step of enhancing the layer of flowed material with a dopant selected from boron, phosphorous, antimony, arsenic, and fluorine.

12. The method of claim 3 wherein the step of dispersing the particles comprises the step of providing the particles comprising one of phospho-silicate glass, boron doped phospho-silicate glass, boron-silicate glass, arsenic doped $SiO_2$, fluorine doped $SiO_2$, and perhydrosilazane.

13. A method of smoothing irregularities in a surface of a semiconductor device comprising the steps of:
   (a) determining a smallest size of the irregularities in the surface of the semiconductor device which are to be smoothed;
   (b) mixing flowable particles having diameters of from 0.01 $\mu$m to 2.0 $\mu$m in a solvent, wherein the particle size of the flowable particles is 5 to 20% of the height of said determined irregularities which are to be smoothed;
   (c) dispersing the mixture of the particles and the solvent onto the surface of the semiconductor device with a spin-on process so as to fill the irregularities in the surface of the semiconductor device with the particles; and
   (d) heating the particles to a temperature from 400° to 900° C. so that they completely flow and fill the irregularities;
   wherein the step of mixing the particles comprises the step of augmenting the flowable particles with non-flowable particles that are about the same diameter as the flowable particles, whereby the layer of flowed particles encapsulates the non-flowable particles.

14. The method of claim 13 wherein the step of mixing the particles comprises the step of providing flowable particles which have a diameter of about 0.1 $\mu$m.

15. The method of claim 13 wherein the step of mixing the particles comprises the step of providing flowable particles which comprise at least one of phospho-silicate glass, boron doped phospho-silicate glass, boron-silicate glass, arsenic doped $SiO_2$, fluorine doped $SiO_2$, and perhydrosilazane.

16. The method of claim 13 further comprising the step of heating the dispersed particles to a temperature less than that needed for complete flow in order to cause the particles to partially flow, before the step of heating the particles so that they completely flow and fill the irregularities.

17. A method of providing a homogeneous layer with augmentors therein on a surface of a semiconductor device comprising the steps of:
   (a) mixing flowable particles and non-flowable augmentor particles;
   (b) dispersing the mixed particles onto the surface of the semiconductor device; and
   (c) heating the mixed particles so that the flowable particles flow and form a homogeneous layer of the flowable particle material which encapsulates the non-flowable augmentor particles.

18. The method of claim 17 wherein the step of mixing the particles comprises the step of providing flowable particles which comprise at least one of phospho-silicate glass, boron doped phospho-silicate glass, boron-silicate glass, arsenic doped $SiO_2$, fluorine doped $SiO_2$, and perhydrosilazane.

19. The method of claim 18 wherein the step of mixing the particles further comprises the step of providing non-flowable particles which comprise at least one of silicon carbide, diamond, titanium dioxide, zinc oxide, aluminum oxide, aluminum nitride and boron nitride.

20. The method of claim 19 wherein the step of mixing the particles comprises the step of providing the flowable and non-flowable particles which have diameters from 0.01 $\mu$m to 2.0 $\mu$m.

21. The method of claim 17 wherein the step of dispersing the mixed particles comprises the step of dispersing the mixed particles with a spin-on process.

22. The method of claim 21 wherein the step of dispersing the mixed particles further comprises the step of mixing the mixed particles in a solvent before they are dispersed in the spin-on process.

23. The method of claim 22 wherein the step of dispersing the mixed particles further comprises the step of applying an ultrasonic frequency to the mixed particles and the solvent to facilitate dispersion of the mixed particles in the solvent.

* * * * *